(12) United States Patent
Ng

(10) Patent No.: US 6,288,405 B1
(45) Date of Patent: Sep. 11, 2001

(54) METHOD FOR DETERMINING ULTRA SHALLOW JUNCTION DOSIMETRY

(75) Inventor: Che-Hoo Ng, San Martin, CA (US)

(73) Assignee: Advanced Mirco Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/295,937

(22) Filed: Apr. 21, 1999

(51) Int. Cl.$^7$ .................................................. H01J 37/317
(52) U.S. Cl. ............................................ 250/492.21; 438/5
(58) Field of Search .............................. 250/492.21; 438/5

(56) References Cited

U.S. PATENT DOCUMENTS

| | | | |
|---|---|---|---|
| 4,831,271 | * 5/1989 | Dearnaley et al. | 250/492.21 |
| 5,185,273 | * 2/1993 | Jasper | 250/492.21 |
| 5,861,632 | * 1/1999 | Rohner | 250/492.21 |
| 6,121,624 | * 9/2000 | Stevie et al. | 250/492.21 |

OTHER PUBLICATIONS

Tan, Samantha H. "Application of vapor phase decomposition techniques (VPD/AAS and ICP–MS) for trace element analysis in oxide coatings on silicon", Nuclear Instruments and Methods in Physics Research B 99, 1995, pp. 458–461.

Balazs, Marjorie K., "Balazs VPD ICP–MS Analysis", Advertising Brochure, Rev. Date: Jun. 1997, Oct. 1998, 5 pages.

Balazs, Marjorie K., "Metal Contamination caused by Ion Implanters", Materials & Process Characterization of Ion Implanters, Ion Beam Press, 1997, pp. 1–8.

* cited by examiner

Primary Examiner—Jack Berman
(74) Attorney, Agent, or Firm—Mikio Ishimaru

(57) ABSTRACT

A method for determining a dosimetry of a semiconductor substrate is provided which is accurate, reliable, simple and inexpensive. The present invention is especially useful for determining dosimetry of ultra shallow junctions formed using low energy implantation commonly found in sub–0.25 $\mu$m technologies. In a preferred embodiment, a material layer of a thickness is formed over a semiconductor substrate, followed by an ion implantation of a dopant. The material layer is then analyzed using a chemical method such as vapor phase plasma deposition inductively coupled plasma mass spectroscopy with atomic absorption (VPD-ICPMS-AA) to determine the amount of dopant present in the material layer.

16 Claims, 2 Drawing Sheets

METHOD FOR DETERMINING ULTRA SHALLOW JUNCTION DOSIMETRY

TECHNICAL FIELD

The present invention relates generally to manufacturing semiconductors and more specifically to a method for monitoring ion implantation of semiconductors.

BACKGROUND ART

Ion implantation is a semiconductor doping process whereby a plurality of dopant atoms are first ionized, then accelerated to velocities sufficient to penetrate the semiconductor surface and deposit within. Well known are semiconductors that can be altered in electrical behavior by the introduction of minute quantities of elemental materials called "dopants". Dopants generally come in either p-type or n-type. P-type dopants (including boron, aluminum, gallium, thallium, indium and/or silicon) produce what is commonly known as hole conductivity while n-type dopants (including phosphorous, arsenic and/or antimony) produce what is commonly known as electron conductivity. The combination of hole and electron regions produces desired devices such as transistors, resistors, diodes, capacitors, etc., which form the basis of semiconductor operation.

An ion implanter is commonly used in the semiconductor industry to introduce dopants into semiconductor substrates. The depth in which dopant ions are introduced into the substrate increases as acceleration voltage of the implanter increases. Moreover, the total number of ions introduced is proportional to the beam current and implant time of the implanter.

Due to the growing popularity of sub–0.25 $\mu$m, low energy (or low current) implanters have become a mainstay in integrated circuit manufacturing. A low energy implanter is required to form ultra shallow junctions in the semiconductor substrates that are necessary for enhanced performance in these high density sub–0.25 $\mu$m circuits.

Integrated circuits are generally formed by interconnecting numerous individual devices set forth by dopant implantation. A single wafer may contain several thousand devices which are diced and individually packaged as a single monolithic circuit. It is important that the doping process be accurately presented to the semiconductor area in order to ensure the monolithic circuit operates according to target parameters. If doping does not bring about such operation, then the corresponding yields may be drastically reduced, thereby adding to the cost of manufacturing. Important factors relating to accurate doping include: (i) the need to control the number of doping ions introduced (dosimetry) in a semiconductor substrate, and (ii) the need to control the depth or concentration profile of dopant placed into the semiconductor substrate. These factors are even more important for sub–0.25 $\mu$m devices and therefore must be closely monitor.

The conventional method of monitoring the number of doping ions introduced in a semiconductor substrate is by integrating the total current collected by a Faraday cup located behind the semiconductor substrate in the implanter. The assumption is that during a particular portion of the implant cycle, the semiconductor wafer is positioned out of the beam and the beam current will fall onto the Faraday cup. As such, the measured charge quantity accurately reflects the amount of dopant ions delivered to the semiconductor substrate.

One drawbacks of using low energy ion implantation is that the beam tends to travel in a divergent pattern instead of a straight-line pattern; the lower the energy, the higher the divergence. Portions of dopant ions from a divergent, low energy beam may not strike the substrate and yet will be collected by the Faraday cup. Hence, the divergent pattern of a low energy beam reduces the accuracy in using the Faraday cup to determine the number of doping ions introduced in the semiconductor substrate.

Other quantitative techniques that are commonly used to determine the amount of dopant ions delivered to a semiconductor substrate include secondary ion mass spectroscopy (SIMS) and spreading resistance probe (SRP). In SIMS techniques, a mass spectrometer is used to identify the elemental compositions of small pieces of materials dislodged from the surfaces of a semiconductor substrate by ion bombardment. To determine elemental compositions in regions of a semiconductor substrate below the surface, such regions must first be exposed. It has been found that the SIMS techniques are not very accurate in determining the amount of dopant ions delivered to a semiconductor substrate for sub–0.25 $\mu$m devices. The problem is due to the difficulty in removing a very small and precise amount of material from the top surface of the semiconductor substrate in order to expose the underlying shallow junctions that have a depth in the range of only about 10 to 100 angstroms. Other drawbacks with the SIMS techniques are that they are very tedious and expensive. In using SRP techniques to determine the doping profile of a semiconductor substrate, the semiconductor substrate is first angle lapped (tapered) and then subject to spreading resistance (SR) measurements along its length using two probes. From the angle of the taper, the depth as a function of distance from the surface of the semiconductor substrate can be found. The doping profile is then computed based on the SR measurement using some well-known equations that govern the relationships between the resistivity, the SR, and the effective electrical contact radius between the probes and the surface of the semiconductor substrate. The SPR techniques, however, are not very accurate or reliable for sub–0.25 $\mu$m application because of the difficulty in making good electrical contacts to the surface of the semiconductor substrate. Furthermore, just like the SIMS techniques, SPR techniques are tedious and expensive.

A solution, which would provide an accurate, reliable, simple and inexpensive method for determining the dosimetry of a semiconductor substrate with sub–0.25 $\mu$m technology, has been long sought but has eluded those skilled in the art. As the semiconductor industry is moving quickly to sub–0.25 $\mu$m technologies, it is becoming more pressing that a solution be found.

DISCLOSURE OF THE INVENTION

The present invention provides a method for determining the dosimetry of a semiconductor wafer.

The present invention provides an accurate, reliable, simple and inexpensive method for determining the dosimetry of a semiconductor substrate using a chemical method.

The present invention further provides a method for determining the dosimetry of a semiconductor wafer by forming a material layer of a thickness over the semiconductor substrate, implanting the semiconductor substrate with a dopant, and analyzing the material layer using a chemical method to determine the amount of dopant present in the material layer.

The above and additional advantages of the present invention will become apparent to those skilled in the art from a reading of the following detailed description when taken in conjunction with the accompanying drawings.

BEST MODE FOR CARRYING OUT THE INVENTION

The present invention provides an accurate, reliable, simple, and inexpensive method for determining the dosimetry of a semiconductor substrate using a chemical method.

Figure 1:
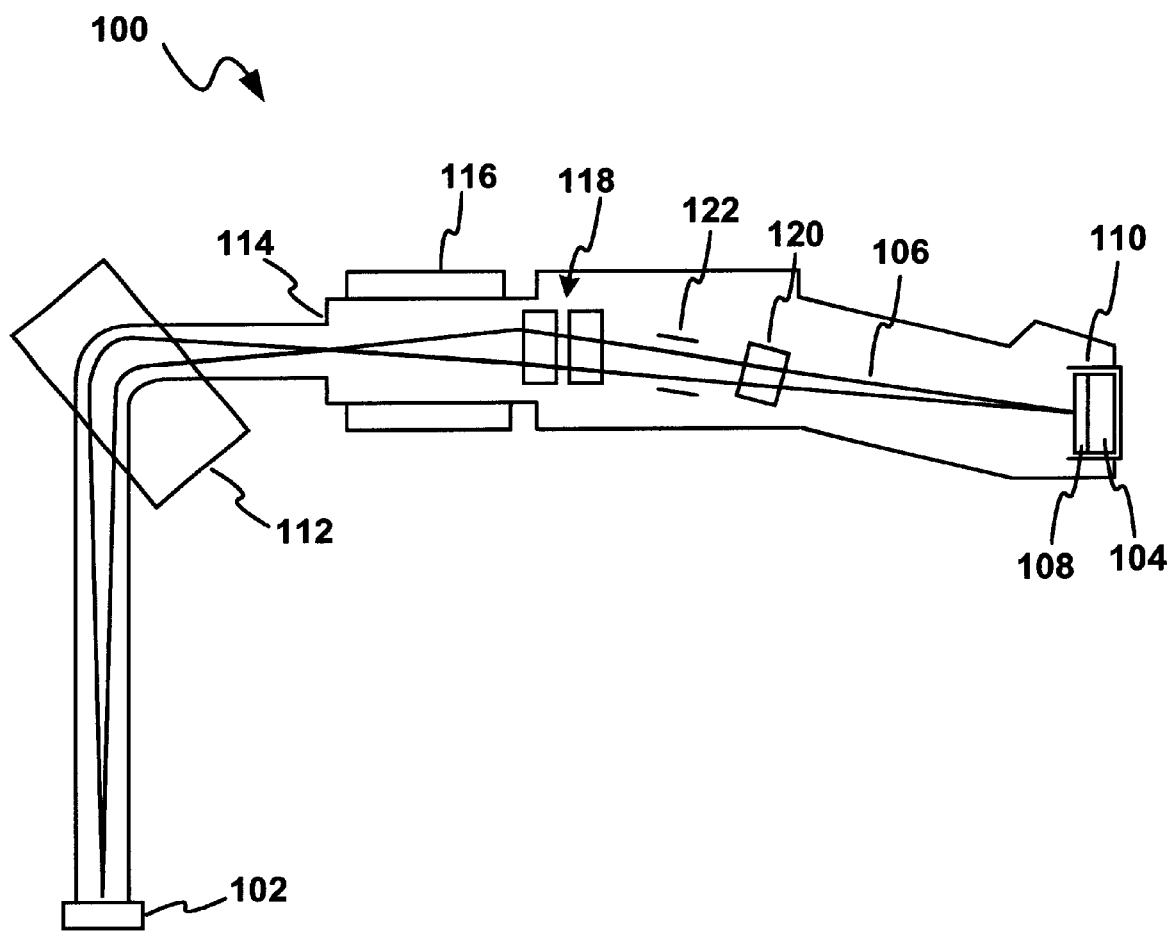
FIG. 1 (PRIOR ART) is a typical low energy ion implanter.

Referring now to FIG. 1 (PRIOR ART), therein is shown a typical low energy ion implanter 100. The ion implanter 100 generally includes an ion source 102, a target area 104, and a low energy ion beam 106 conditioned between source 102 and target 104. A semiconductor substrate 108 is placed within the target area 104. Surrounding the substrate 108 and the target area 104 is a Faraday cup 110 which is coupled to a current measuring device (not shown) for measuring the number of doped ions introduced to the substrate 108 by integrating the total current collected by the Faraday cup 110. Placed within the path of ion beam 106 are numerous conditioning elements. In particular, a mass analyzer 112 is used to filter, or select, various ion species based on the charge-to-mass ratio of the extracted ions. The analyzer 112 is generally sensitive enough to discriminate against adjacent mass numbers. The ions are then given a final acceleration from a resolving aperture 114 via an acceleration tube 116. The accelerated ions produced at the output of the tube 116 are then focused to a fairly close or "tight" beam width via lens 118. The focused beam can then be deflected by x- and y-deflector plates 120 and 122, respectively. X- and y-deflector plates 120 and 122 receive modulated voltage (not shown) so as to scan the focused ion beam 106.

As explained in the BACKGROUND ART, the low energy beam 106 diverges so that portions of dopant ions may not strike the substrate 108 but are collected by the Faraday cup 110. Hence, the dosimetry obtained by integrating the total current collected by the Faraday cup 110 is not accurate and is higher than the actual dosimetry of the substrate 108.

The present invention provides an accurate, reliable, simple, and inexpensive method for determining the dosimetry of a semiconductor substrate using a chemical method. The present invention is particularly applicable to low energy implant for ultra shallow junctions such as those formed using sub–0.25 μm technologies.

Figure 2A:
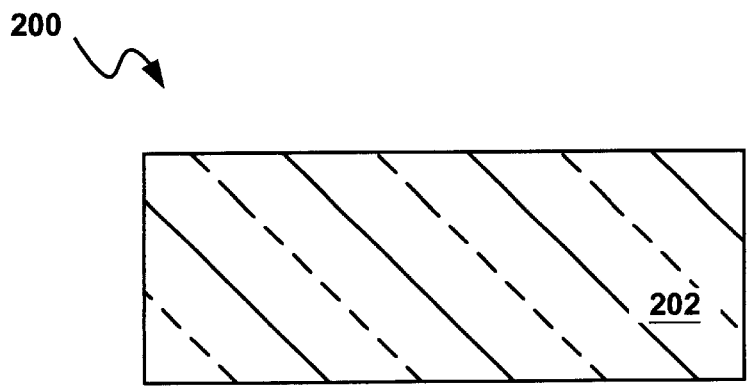
FIGS. 2A through 2C illustrate the process steps for determining the dosimetry of a semiconductor substrate in accordance with the present invention.
Figure 2B:
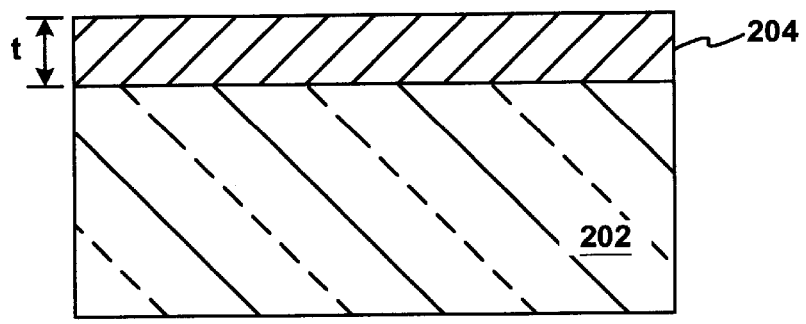
Figure 2C:
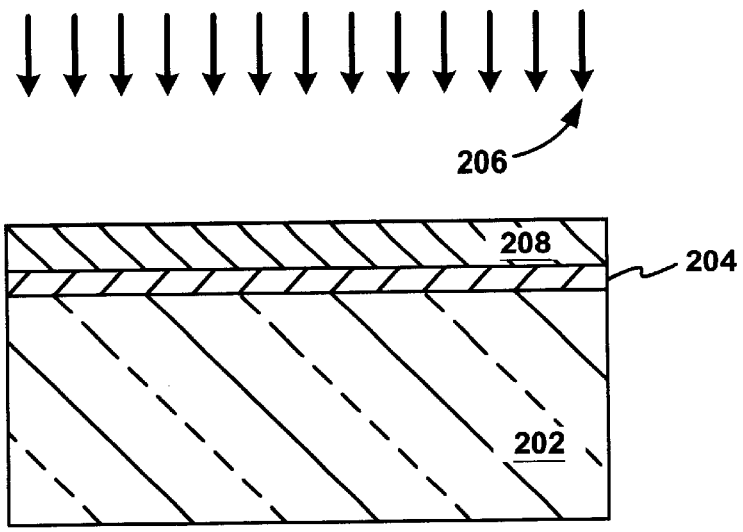

FIGS. 2A through 2C illustrate the process steps for determining the dosimetry of a semiconductor wafer using a chemical method in accordance with the present invention.

Referring now to FIG. 2A, therein is shown the cross-section of a semiconductor monitor wafer 200 with a silicon substrate 202.

Referring now to FIG. 2B, therein is shown the formation of a material layer 204 over the silicon substrate 202. The material layer 204 may be formed using conventional deposition techniques such as chemical vapor deposition. The thickness of the material layer 204 is equal to t.

Referring now to FIG. 2C, therein is shown the ion implantation 206 of a dopant at an energy and a concentration to form a doped region 208 within the material layer 204. It should be noted that the material layer 204 with thickness t is high enough to capture more than about 99.9% of the dopant implanted in the silicon substrate 202.

The material layer 204 is then analyzed using a chemical method to determine the amount of dopant present in the material layer 204.

In production, a material layer 204 is formed over the silicon substrate 202 using chemical vapor deposition. The material layer includes a material selected from the group consisting of an oxide, a nitride, and polysilicon. In a preferred embodiment, the material layer includes a material selected from the group consisting of silicon dioxide, silicon oxynitride, and silicon nitride. The material layer 204 is formed to a thickness t which is high enough to capture more than 99.9% of dopant in the subsequent ion implantation of the silicon substrate 202. The value of t can be easily computed for a given implant dopant, energy, and concentration.

The next step is the ion implantation 206 of the dopant at an energy and a concentration to form a doped region 208 within the material layer 204. In a preferred embodiment, the thickness t is high enough to capture more than about 99.99% of dopant implanted in the silicon substrate 202.

After the ion implantation 206, the material layer 204 is analyzed using a chemical method to determine the amount of dopant present in the material layer 204. In a preferred embodiment, the material layer 204 is first separated from the silicon substrate 202 by dissolving in a solvent. The solvent is then evaluated using vapor phase decomposition inductively coupled plasma mass spectroscopy with atomic absorption (VPD-ICPMS-AA). This process was first developed for the measurement of the purity of a thermal oxide. Later, it was used for the evaluation of cleanliness of the native oxides after wafer cleaning. Even more recently, it has been used for the measurement and identification of metal contamination and metal impurities contributed during ion implantation, plasma etching/ashing, and other oxidation/deposition processes. The VPD-ICPMS-AA performed using chemical analysis tools available such as the Varian Zeeman 800 GFAAS or the JEOL Plasmax-2. The first is available from Varian Semiconductor Equipment, 35 Dory Road, Gloucester, Mass. and the second is available from Jeol USA, Inc., 11 Dearborn Road, Peabody, Mass. By using the VPD-ICPMS-AA, the dosimetry of the silicon substrate 202 can be accurately determined. In addition, the VPD-ICPMS-AA process is reliable, simple to use, and inexpensive.

The semiconductor monitor wafer 200 may be used (i) for the initial set up of an implanter prior to the implantation of production wafers, (ii) for monitoring production process; or (iii) as a tool for process development.

Therefore, the present invention provides an accurate, reliable, simple, and inexpensive method for determining the dosimetry of a semiconductor substrate using a chemical method. The present invention is especially useful for determining dosimetry of ultra shallow junctions formed using low energy implantation commonly found in sub–0.25 μm technologies.

While the best mode utilizes a semiconductor monitor wafer as examples, it should be understood that the present invention is applicable to production semiconductor wafers with circuits formed thereon. In addition, besides oxide, nitride and polysilicon, other materials can be used to form the material layers. So long as such other materials can be (i) formed as a layer of precise thickness over a semiconductor substrate; (ii) implanted with dopants, (iii) separated from the underlying substrate after the implantation, and (iv) analyzed using a chemical method such as VPD-ICPMS-AA to determine the amount of dopant present in the layer.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for determining a dosimetry of a semiconductor substrate, comprising the steps of:
   forming a material layer of a thickness over the semiconductor substrate;
   implanting the semiconductor substrate with a dopant; and
   analyzing said material layer using a chemical method to determine the amount of dopant present in said material layer.

2. The method as claimed in claim 1 wherein said semiconductor substrate is a silicon substrate.

3. The method as claimed in claim 1 wherein said material layer comprises a material selected from the group consisting of an oxide, a nitride, and a polysilicon.

4. The method as claimed in claim 1 wherein said material layer comprises a material selected from the group consisting of silicon oxide, silicon oxynitride and silicon nitride.

5. The method as claimed in claim 1 wherein the step of forming said material layer is done by chemical vapor deposition.

6. The method as claimed in claim 1 wherein the step of implanting the semiconductor substrate implants more than about 99.9% of said dopant within said material layer.

7. The method as claimed in claim 1 wherein the step of forming said material layer includes a step of determining said thickness so that more than about 99.9% of said dopant is captured by said material layer in the step of implanting said semiconductor substrate.

8. The method as claimed in claim 1 wherein the step of analyzing said material layer using a chemical method comprises the steps of separating said material layer from the semiconductor substrate by dissolving said material layer in a solvent, and evaluating said solvent using vapor phase plasma deposition inductively coupled plasma mass spectroscopy with atomic absorption (VPD-ICPMS-AA).

9. A method for determining a dosimetry of a silicon substrate, comprising the steps of:
   forming a material layer of a thickness over the silicon substrate, wherein said material layer comprises a material selected from the group consisting of an oxide, a nitride, and a polysilicon;
   implanting the silicon substrate with a dopant; and
   analyzing said material layer using a chemical method to determine the amount of dopant present in said material layer.

10. The method as claimed in claim 9 wherein said material layer comprises a material selected from the group consisting of silicon oxide, silicon oxynitride and silicon nitride.

11. The method as claimed in claim 9 wherein the step of the step of forming said material layer is done by chemical vapor deposition.

12. The method as claimed in claim 9 wherein the step of implanting the silicon substrate implants more than about 99.99% of said dopant within said material layer.

13. The method as claimed in claim 9 wherein the step of forming said material layer includes a step of determining said thickness so that more than about 99.99% of said dopant are captured by said material layer in the step of implanting said silicon substrate.

14. The method as claimed in claim 9 wherein the step of analyzing said material layer using a chemical method comprises the steps of separating said material layer from the silicon substrate by dissolving said material layer in a solvent, and evaluating said solvent using vapor phase plasma deposition inductively coupled plasma mass spectroscopy with atomic absorption (VPD-ICPMS-AA).

15. A method for determining a dosimetry of a silicon substrate, comprising the steps of:
   forming a material layer of a thickness over the silicon substrate using chemical vapor deposition, wherein said material layer comprises a material selected from the group consisting of silicon oxide, silicon oxynitride, silicon nitride, and polysilicon;
   implanting the silicon substrate with a dopant, wherein the step of forming said material layer includes a step of determining said thickness so that more than about 99.99% of said dopant are captured by said material layer in the step of implanting the silicon substrate; and
   analyzing said material layer using a chemical method to determine the amount of dopant present in said material layer.

16. The method as claimed in claim 15 wherein the step of analyzing said material layer using a chemical method comprises the steps of separating said material layer from the silicon substrate by dissolving said material layer in a solvent, and evaluating said solvent using vapor phase plasma deposition inductively coupled plasma mass spectroscopy with atomic absorption (VPD-ICPMS-AA).

* * * * *